United States Patent
Wilson et al.

(10) Patent No.: US 8,294,508 B2
(45) Date of Patent: Oct. 23, 2012

(54) METHOD AND DEVICE FOR DRIVING THE FREQUENCY OF A CLOCK SIGNAL OF AN INTEGRATED CIRCUIT

(75) Inventors: Robin Wilson, Saint Martin d'Uriage (FR); Sylvain Engels, Meylan (FR); Eric Balossier, Grenoble (FR)

(73) Assignees: STMicroelectronics SA, Montrouge (FR); STMicroelectronics (Crolles 2) SAS, Crolles (FR)

( * ) Notice: Subject to any disclaimer, the term of this patent is extended or adjusted under 35 U.S.C. 154(b) by 96 days.

(21) Appl. No.: 12/986,428

(22) Filed: Jan. 7, 2011

(65) Prior Publication Data
US 2011/0199149 A1 Aug. 18, 2011

(30) Foreign Application Priority Data
Jan. 8, 2010 (FR) ...................................... 10 50094

(51) Int. Cl.
*H01L 35/00* (2006.01)
(52) U.S. Cl. .......................... 327/512; 327/291; 327/566
(58) Field of Classification Search .................. 327/291, 327/512, 513, 564, 565, 566
See application file for complete search history.

(56) References Cited

U.S. PATENT DOCUMENTS

| | | | | |
|---|---|---|---|---|
| 5,481,210 | A | 1/1996 | Genzel | 326/93 |
| 5,774,704 | A | 6/1998 | Williams | 395/556 |
| 6,943,613 | B2 * | 9/2005 | Miyazaki et al. | 327/534 |
| 7,936,203 | B2 * | 5/2011 | Zimlich | 327/512 |
| 2007/0076498 | A1 | 4/2007 | Ho et al. | 365/208 |
| 2007/0279642 | A1 | 12/2007 | Shmarev | 356/521 |
| 2008/0030708 | A1 | 2/2008 | Hansen et al. | 355/71 |
| 2008/0048273 | A1 | 2/2008 | Lenoble | 257/401 |
| 2008/0050897 | A1 | 2/2008 | Kottantharayil | 438/513 |

OTHER PUBLICATIONS

Arnaud et al., "32nm general purpose bulk CMOS technology for high performance applications at low voltage", Electron Devices Meeting, IEEE International, Dec. 2008, pp. 1-4.
Arnaud et al., "Competitive and cost effective high-k based 28nm CMOS technology for low power applications", 2009 IEEE International Electron Devices Meeting (IEDM) Dec. 2009, pp. 1-4.
Diaz et al., "32nm gate-first high-k/metal-gate technology for high performance low power applications", Electron Devices Meeting, IEEE International, Dec. 2008, pp. 1-4.
Fleischmann, "Long run power management", Transmeta Corporation, Jan. 2001, pp. 1-23.
Haran et al., "22 nm Technology Compatible Fully Functional 0.1 μm2 6T-SRAM Cell", Electron Devices Meeting, Dec. 2008, pp. 1-4.
Henson et al., "Gate Length Scaling and High Drive Currents Enabled for High Performance SOI Technology using High-k/Metal Gate", Electron Devices Meeting, IEEE International, Dec. 2008, pp. 1-4.

(Continued)

*Primary Examiner* — Jeffrey Zweizig
(74) *Attorney, Agent, or Firm* — Allen, Dyer, Doppelt, Milbrath & Gilchrist, P.A.

(57) ABSTRACT

An electronic device may include a controlled generator configured to generate an adjustable frequency clock signal at at least one part of an integrated circuit coupled to the output of the controller generator and including at least one transistor having a gate of less than forty-five nanometers in length. The electronic device may include determination circuitry configured to determine the temperature of the at least one part of the integrated circuit, and drive circuitry coupled to the determination circuitry and configured to control the generator to increase the frequency of the clock signal when the temperature increases.

22 Claims, 3 Drawing Sheets

OTHER PUBLICATIONS

Kamiyama et al., "Systematic Study of Vth Controllability Using ALD-Y2O3, La2O3 and MgO2 layers with HfSiON/Metal Gate First n-MOSFETs for hp 32 nm Bulk Devices", Electron Devices Meeting, IEEE International, Dec. 2008, pp. 1-4.

Kawasaki et al., "Demonstration of Highly Scaled FinFET SRAM Cells with High-K/Metal Gate and Investigation of Characteristic Variability for the 32 nm node and beyond", Electron Devices Meeting, IEEE International, Dec. 2008, pp. 1-4.

Miyashita et al., "Physical and Electrical Analysis of the Stress Memorization Technique (SMT) using Poly-Gates and its Optimization for Beyond 45-nm High-Performance Applications", Electron Devices Meeting, IEEE International, Dec. 2008, pp. 1-4.

Natarajan et al., "A 32 nm Logic Technology Featuring 2nd-Generation High-k + Metal-Gate Transistors, Enhanced Channel Strain and 0.171 μm2 SRAM Cell Size in a 291Mb Array", Electron Devices Meeting, IEEE International, Dec. 2008, pp. 1-3.

Sanchez et al, "Thermal management system for high performance PowerPC™ microprocessors" Motorola Inc. compcon Proceedings,IEEE, 1997, pp. 325-330.

Yang et al., "Scaling of 32nm Low Power SRAM with High-K Metal Gate", Electron Devices Meeting, IEEE International, Dec. 2008, pp. 1-4.

* cited by examiner

ND FOR DRIVING THE
METHOD AND DEVICE FOR DRIVING THE FREQUENCY OF A CLOCK SIGNAL OF AN INTEGRATED CIRCUIT

FIELD OF THE INVENTION

The invention relates to integrated circuits, and, more particularly, to the driving of the frequency of a clock signal of an integrated circuit comprising transistors produced using complementary metal oxide semiconductor (CMOS) technology devices below 45 nanometers, and in particular, using CMOS technology devices of 32 nanometers.

BACKGROUND OF THE INVENTION

It may be recalled that the size of a device defines the gate length of CMOS transistors. The transistors produced using CMOS technology below 45 nanometers, and, more particularly, 32 nanometers form the subject of numerous publications, in particular "32 nm General Purpose Bulk CMOS Technology for High Performance Application at Low Voltage (Electron Devices Meeting, 2008, IEDM 2008, IEEE International, p. 1 to 4, ISSN: 8164-2284, ISBN: 978-1-4244-2377-4, published on 15-17 Dec. 2008)", "32 nm Gate-First High-k/Metal-Gate Technology for High Performance Low Power Applications (Electron Devices Meeting, 2008, IEDM 2008, IEEE International, p. 1 to 4, ISSN: 8164-2284, ISBN: 978-1-4244-2377-4, published on 15-17 Dec. 2008)" and "A 32 nm Logic Technology Featuring $2^{nd}$-Generation High-k+ Metal-Gate Transistors, Enhanced Channel Strain and 0.171 $\mu m^2$ SRAM Cell Size in a 291 Mb Array (Electron Devices Meeting, 2008, IEDM 2008, IEEE International, p. 1 to 4, ISSN: 8164-2284, ISBN: 978-1-4244-2377-4, published on 15-17 Dec. 2008)".

Moreover, studies of characteristics and performance of these transistors have also been published, such as, for example, in the publications "Physical and Electrical Analysis of the Stress Memorization Technique (SMT) using Poly-Gates and its Optimization for Beyond 45 -nm High-Performance Application (Electron Devices Meeting, 2008, IEDM 2008, IEEE International, p. 1 to 4, ISSN: 8164-2284, ISBN: 978-1-4244-2377-4, published on 15-17 Dec. 2008)" and "Gate Length Scaling and High Drive Currents Enabled for High Performance SOI Technology using High-k/Metal Gate (Electron Devices Meeting, 2008, IEDM 2008, IEEE International, p. 1 to 4, ISSN: 8164-2284, ISBN: 978-1-4244-2377-4, published on 15-17 Dec. 2008)".

For example, "Scaling of 32 nm Low Power SRAM with High-K Metal Gate (Electron Devices Meeting, 2008, IEDM 2008, IEEE International, p. 1 to 4, ISSN: 8164-2284, ISBN: 978-1-4244-2377-4, published on 15-17 Dec. 2008)" and "Demonstration of Highly Scaled FinFET SRAM Cells with High-K/Metal Gate and Investigation of Characteristic Variability for the 32 nm node and beyond (Electron Devices Meeting, 2008, IEDM 2008, IEEE International, p. 1 to 4, ISSN: 8164-2284, ISBN: 978-1-4244-2377-4, published on 15-17 Dec. 2008)" disclose several analyses of the performance of static random access memory (SRAM) manufactured based upon 32-nanometer CMOS technology transistors. For example, "22 nm Technology Compatible Fully Functional 0.1 $\mu m^2$ 6T-SRAM Cell (Electron Devices Meeting, 2008, IEDM 2008, IEEE International, p.1 to 4, ISSN: 8164-2284, ISBN: 978-1-4244-2377-4, published on 15-17 Dec. 2008)" discloses several analyses of the performance of memories of SRAM manufactured based upon 22-nanometer CMOS technology transistors.

SUMMARY OF THE INVENTION

In view of the foregoing, it has been observed that the transition frequency of transistors produced using CMOS technology below 45 nanometers, and, in particular, 32 nanometers, increases when the mean temperature of the transistors increases regardless of the supply voltage of the transistors. This is contrary to established preconceptions.

A method of driving the frequency of a clock signal delivered to at least one part of an integrated circuit comprising at least one transistor having a gate of less than forty-five nanometers in length, for example, less than or equal to thirty-two nanometers is described. The part of the integrated circuit may include logic gates including transistors having a gate of less than forty-five nanometers in length. The part of the integrated circuit may include any type of circuit based on transistors intended to receive a clock signal. Moreover, the remainder of the integrated circuit may include other types of circuits, such as, for example, analog circuits that may not use a clock signal. As a variant, the clock signal may be used in the entirety of the integrated circuit.

The method comprises determining the temperature of the at least one part of the integrated circuit and increasing the frequency of the clock signal when the temperature increases. In practice, for example, a nominal value of frequency may be fixed for the clock signal corresponding to a reference temperature, for example 20° C., and this reference temperature may be a basis for deciding whether or not to increase the frequency of the clock signal.

The transition frequency of a transistor may correspond to the operating speed of a transistor, or in other words, the frequency for which the transistor switches from the off state to the on state. Moreover, the frequency of the clock signal delivered to the integrated circuit may correspond, in particular, to the operating frequency of the circuit, or the frequency of the control signals emitted on the gate of the transistors to control the latter to turn them on or off.

By virtue of driving the frequency of the clock signal of the integrated circuit as a function of the temperature of the circuit, the frequency of the transistors is adjusted, so as to increase the operating speed of the integrated circuit. For example, the frequency of the clock signal may be increased by tiers corresponding to temperature tiers.

The method may also comprise halting the increasing of the frequency of the clock signal when the temperature is greater than a threshold. Thus, it may be possible to operate the integrated circuit in a temperature span of determined dependability. By way of a non-limiting example, this temperature span may be between −40° C. and 125° C., and in this case, the threshold is equal to 125° C.

Furthermore, the method may comprise decreasing the frequency of the clock signal when the temperature decreases. Indeed, when the temperature of the integrated circuit decreases with respect to the reference temperature or with respect to a higher previous temperature, the frequency of the clock signal may no longer be suited to the operation of the integrated circuit at this new lower temperature, and the frequency of the clock signal may then be decreased.

According to another aspect, an electronic device may include a controlled generator to generate a clock signal of adjustable frequency at at least one part of an integrated circuit coupled to the output of the generator and comprising at least one transistor having a gate of less than forty-five nanometers in length, for example, less than or equal to thirty-two nanometers in length. This electronic device may include a determination circuit, or determination means for determining the temperature of the at least one part of the integrated circuit, and a drive circuit, or drive means coupled to the determination means and configured to control the generator so as to increase the frequency of the clock signal when the temperature increases.

According to an embodiment, the gate of the at least one transistor may comprise a metallic layer. According to another embodiment, the gate of the at least one transistor may comprise a dielectric having a relative permittivity of greater than five.

For example, the drive means may be configured to control the generator to increase the frequency of the clock signal by tiers corresponding to temperature tiers. The drive means may also include a protection circuit, or protection means configured to control the generator to halt the increasing of the frequency of the clock signal when the temperature is greater than a threshold. Furthermore, the drive means may be configured to control the generator so as to decrease the frequency of the clock signal when the temperature decreases.

According to another embodiment, the at least one part of the integrated circuit may include logic gates including transistors having gates of length less than forty-five nanometers. According to yet another embodiment, the at least one part of the integrated circuit may comprise logic gates including transistors having gates of length equal to thirty-two nanometers.

Advantageously, the supply voltage of the at least one transistor may be between zero volts and an admissible maximum supply voltage of the transistor, for example, 1.1 volts. Thus, it may be possible to provide a device for driving the frequency of the clock signal whatever the supply voltage of the transistors of the integrated circuit. According to another aspect, a microprocessor may comprise a device such as defined above. Other advantages and characteristics will be apparent on examining the detailed description of wholly non-limiting modes of implementation and embodiments of the invention, and the appended drawings.

DETAILED DESCRIPTION OF THE PREFERRED EMBODIMENTS

Figure 1:
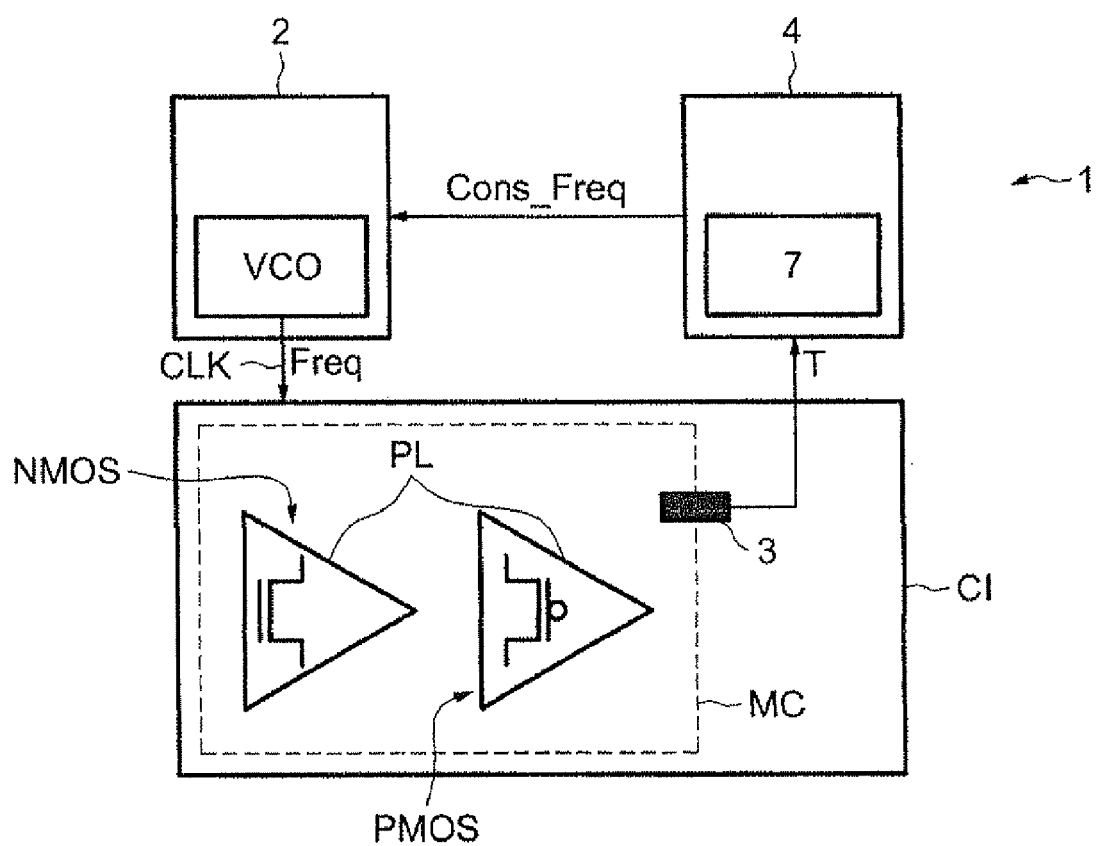
FIG. 1 is a schematic diagram of a device for driving the frequency of a clock signal of an integrated circuit according the present invention.

Referring to FIG. 1, an electronic device 1 includes means, or circuitry, for driving of the frequency Freq of a clock signal CLK delivered to an integrated circuit CI.

The integrated circuit CI comprises, in this example, at least one part MC comprising logic gates PL and/or logic circuits based on n-channel metal oxide semiconductor (NMOS) and/or p-channel metal oxide semiconductor (PMOS) transistors having a gate length of less than 45 nanometers, for example, 32 nanometers. The gate length may be other values.

The production of these NMOS and/or PMOS transistors is known and comprises the conventional steps of producing a transistor that considers the relatively low value of the gate length. This is the case, in particular, for the production of the gate.

More precisely, the doping of these NMOS and/or PMOS transistors may be performed with the aid of a primary ion beam directed onto a first target with an incident angle different from zero, so as to create a secondary ion beam to dope the NMOS, PMOS transistors. A person skilled in the art may refer to, for example, U.S. patent application publication Nos. 2008/0048273 and 2008/0050897.

Moreover, to produce the gates, a nanometric photolithography of less than 45 nanometers, for example, a 32-nanometer photolithography, is used. A person skilled in the art may refer to U.S. patent application publication No. 2007/0279642, which describes a photolithographic apparatus for an integrated circuit which splits a light beam into two beams with the aid of a prism. Each beam passes through two enlarging lenses, and then the apparatus redirects and recombines the two beams on the surface of a substrate to form an interference design. A person skilled in the art may also refer to U.S. patent application publication No. 2008/0030708, which describes a photolithographic apparatus for the production of narrow semiconductor gates, for example, gates of length equal to 32 nanometers, which comprises a means, or device, for generating an inclined incident light beam and which uses a chromium-free phase shift photographic mask of rectangular shape to phase modulate the incident light so as to produce interference.

Moreover, transistors having a gate comprising a metallic layer instead of polysilicon may be produced. Indeed, a metallic layer is used to avoid the depletion zone, which exists in the case of a silicon gate, and to be compatible with materials of relatively high permittivity, termed "high K." For example, it may be possible to use molybdenum or tantalum nitride (TaN), and preferably, titanium nitride (TiN), to produce the metallic layer.

Furthermore, transistors having a relatively high-permittivity gate dielectric may preferably be produced. "High permittivity" is typically understood as a dielectric having a relative permittivity of greater than 5. It may also be noted that the permittivity of a dielectric is calculated based upon the permittivity in a vacuum $\epsilon_0$ according to the following equation (1):

$$\epsilon = \epsilon_0 \cdot \epsilon_r \qquad \text{(equation 1)}$$

$\epsilon$: absolute permittivity of the dielectric, $\epsilon_0$: permittivity in a vacuum equal to $8.85418782 \cdot 10^{-12}$ $F \cdot m^{-1}$, $\epsilon_r$: relative permittivity of the dielectric, dimensionless.

This high-permittivity dielectric may be, for example, a hafnium oxide ($HfO_2$), a zirconium oxide ($ZrO_2$), a yttrium oxide ($Y_2O_3$), or a lanthanum oxide ($ZrO_2$). For example, it may be possible to produce a high-permittivity dielectric with the silicon-hafnium oxynitride (HfSiON) in combination with a metallic layer of titanium nitride (TiN).

The person skilled in the art will also be able to refer, for all useful purposes, to the publication entitled, "Systematic Study of Vth. Controllability Using ALD-$Y_2O_3$, $La_2O_3$ and $MgO_2$ layers with HfSiON/Metal Gate First n-MOSFETs for hp 32 nm Bulk Devices (Electron Devices Meeting, 2008, IEDM 2008, IEEE International, p. 1to 4, ISSN: 8164-2284, ISBN: 978-1-4244-2377-4, published on 15-17 Dec. 2008)" which describes the components used in the design of the gates of transistors produced using 32-nanometer CMOS technology. With respect to technologies of less than 32 nanometers, in particular 28 nanometers, a person skilled in the art may refer to the publication, "Competitive and Cost Effective high-k based 28 nm CMOS Technology for Low Power Application" which was made public during the 2009 IEEE International Electron Devices Meeting (IEDM) held in Baltimore, Maryland from Dec. 7-9, 2009. The above publication described that transistors having a metallic gate of length equal to 28 nanometers have been produced based upon methods arising from 32-nanometer technology. This publication also describes that the gates of transistors produced in 28-nanometer technology have a density of between 3900 and 4200 $kg/mm^2$, and which is greater than that of transistors produced in 32-nanometer technology (whose density is equal to about 3550 $kg/mm^2$), and that of transistors produced in 45-nanometer technology (whose density is equal to about 1800 $kg/mm^2$). The inventors have noted that when the temperature of the NMOS and/or PMOS transistors produced using a CMOS technology of below 45-nanometers increases, it typically induces an increase in the transition frequency of the transistors, and therefore an increase in the operating speed of the transistor, irrespective of the value of the supply voltage of the NMOS and/or PMOS transistors.

According to an embodiment, the electronic device 1 comprises a generator 2 configured to generate the clock signal CLK having the frequency Freq, determination means, or circuitry 3 for determining a temperature T of the part MC of the integrated circuit CI, and drive means, or circuitry 4 for the generator 2. The determination means, or circuitry, 3 may be, for example, a temperature sensor, coupled to the drive means or circuitry 4.

The generator 2 formulates the clock signal CLK of the integrated circuit CI, and, in particular that of the part MC. This generator 2 can comprise, for example, a voltage-controlled oscillator VCO whose output delivers the clock signal CLK.

The drive means, or circuitry, 4 receive the temperature T of the part MC of the integrated circuit, determined by the determination means, or circuitry 3. The drive means 4 are also coupled to the control input of the generator 2 and are configured to control the generator 2 to increase or decrease the frequency of the clock signal as a function of the temperature T. In this regard, the drive means 4 formulate and transmit to the generator 2 a frequency setpoint Cons_Freq which, in the case of the use of a voltage-controlled oscillator VCO, is a control voltage.

The drive means, or circuitry, 4 also comprise comparison means or circuitry for comparing the determined temperature T with temperature thresholds to formulate the frequency setpoint Cons_Freq. The drive means 4 are, in particular, configured to control the generator 2 to initialize the clock signal CLK at a nominal value of frequency Freq0 corresponding to a reference temperature, for example 20° C.

As indicated above, the drive means, or circuitry, 4 are configured to control the generator 2 so as to increase the frequency Freq of the clock signal CLK when the temperature T increases. This increase in frequency of the clock signal Freq gives rise to an increase in the transition frequency of the NMOS and/or PMOS transistors, and also gives rise to an increase in the mean temperature of the part MC of the integrated circuit CI. For example, the drive means 4 can control the generator 2 to increase the frequency Freq of the clock signal by successive temperature tiers. Indeed, it is possible, for example, to produce the drive means 4 so as to provide a first frequency setpoint Cons_Freq1, when the temperature T is between two temperature thresholds that are higher than the reference temperature, and to provide a second frequency setpoint Cons_Freq2 of a greater value than the first frequency setpoint Cons_Freq1, when the temperature T exceeds the high threshold of higher temperature. The frequency setpoints Cons_Freq1, Cons_Freq2 are received by the generator 2 and the latter formulates, respectively, two values Freq1, Freq2 for the frequency of the clock signal CLK. For example, the temperature thresholds may be equal to 50° C. and 125° C. respectively.

Moreover, the frequency setpoints Cons_Freq1, Cons_Freq2 may be formulated, by the drive means 4 based upon a lookup table of correspondences between the frequency setpoint Cons_Freq of the clock signal CLK and the temperature T. The drive means 4 comprise protection means 7, or circuitry, configured to control the generator 2 to halt the increase in the frequency Freq of the clock signal CLK when the temperature T is greater than a protection temperature threshold Tprot. These protection means, or circuitry 7 may make it possible to prevent or reduce any deterioration of the PMOS and/or NMOS transistors of the part MC of the integrated circuit CI due to an excessive increase in the temperature T. The protection temperature threshold Tprot is determined as a function of the characteristics of the PMOS and/or NMOS transistors. For example, it may be equal to 150° C. for transistors used in the automobile sector.

Moreover, the drive means or circuitry, 4 are configured to control the generator 2 to decrease the frequency Freq of the clock signal CLK when the temperature T of the integrated circuit CI decreases to adapt the frequency Freq of the clock signal as a function of the temperature T.

The drive means or circuitry 4 may be embodied as software within a microprocessor and/or by logic circuits. The electronic device 1, which has just been described, may be produced in all or part in an integrated manner. Thus, the controlled generator 2 and/or the drive means 4 may be produced within an integrated circuit, which may be different from the integrated circuit CI or else be produced directly on the integrated circuit CI.

Figure 2:
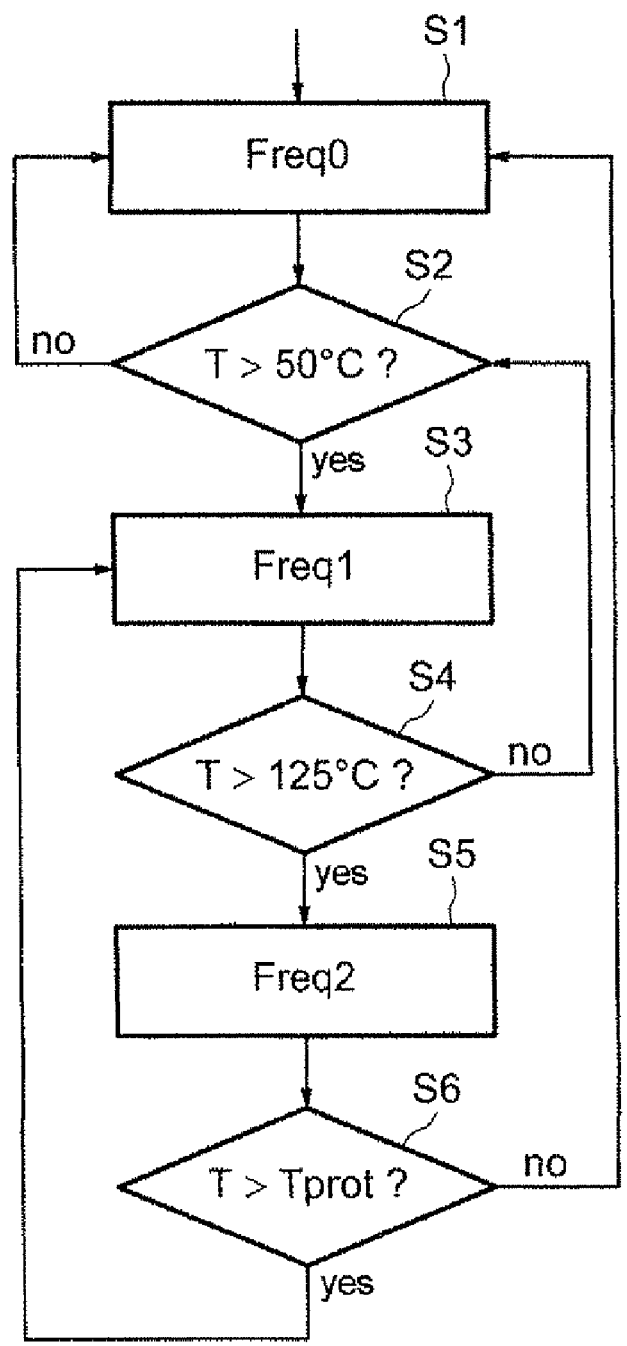
FIG. 2 is a flow diagram of a method of driving the frequency of a clock signal of an integrated circuit according to the present invention.

Referring to FIG. 2, a mode of implementation of a method of driving the frequency of the clock signal of a part MC of an integrated circuit CI comprising at least one transistor having a gate of length less than 45 nanometers, for example, equal to 32 nanometers is illustrated by way of the flow diagram. This method may be implemented by the device 1, which has just been described.

In a first step S1, the frequency of the clock signal delivered to an integrated circuit CI is initialized to a nominal value of frequency Freq0 corresponding to a reference temperature. Next, a second step S2 is performed in which the temperature T of the part MC of the integrated circuit CI is compared with a first temperature threshold higher than the reference temperature. This first temperature threshold may be, for example, equal to 50° C. If the temperature T is greater than the first temperature threshold, a third step S3 is then performed, while in the converse case the frequency Freq is not modified.

In the third step S3, the clock signal having a second frequency Freq1 of greater value than the nominal value of frequency Freq0 is delivered to the integrated circuit CI. A fourth step S4 is performed thereafter in which the temperature T is compared with a second temperature threshold, for example, equal to 125° C. The second temperature threshold is greater than the first temperature threshold. If the temperature T is greater than the second temperature threshold, a fifth step S5 is performed, and the second comparison step S2 is performed again in the converse case.

During the fifth step S5, the clock signal having a third frequency Freq2 of a greater value than the second frequency Freq1 is delivered to the integrated circuit CI. A sixth step 56 of protection is performed thereafter, in which the temperature T is compared with a protection temperature threshold Tprot. If the temperature T is greater than the protection temperature threshold Tprot, the third step S3 is performed again and the first step S1 is performed again in the converse case.

Figure 3:
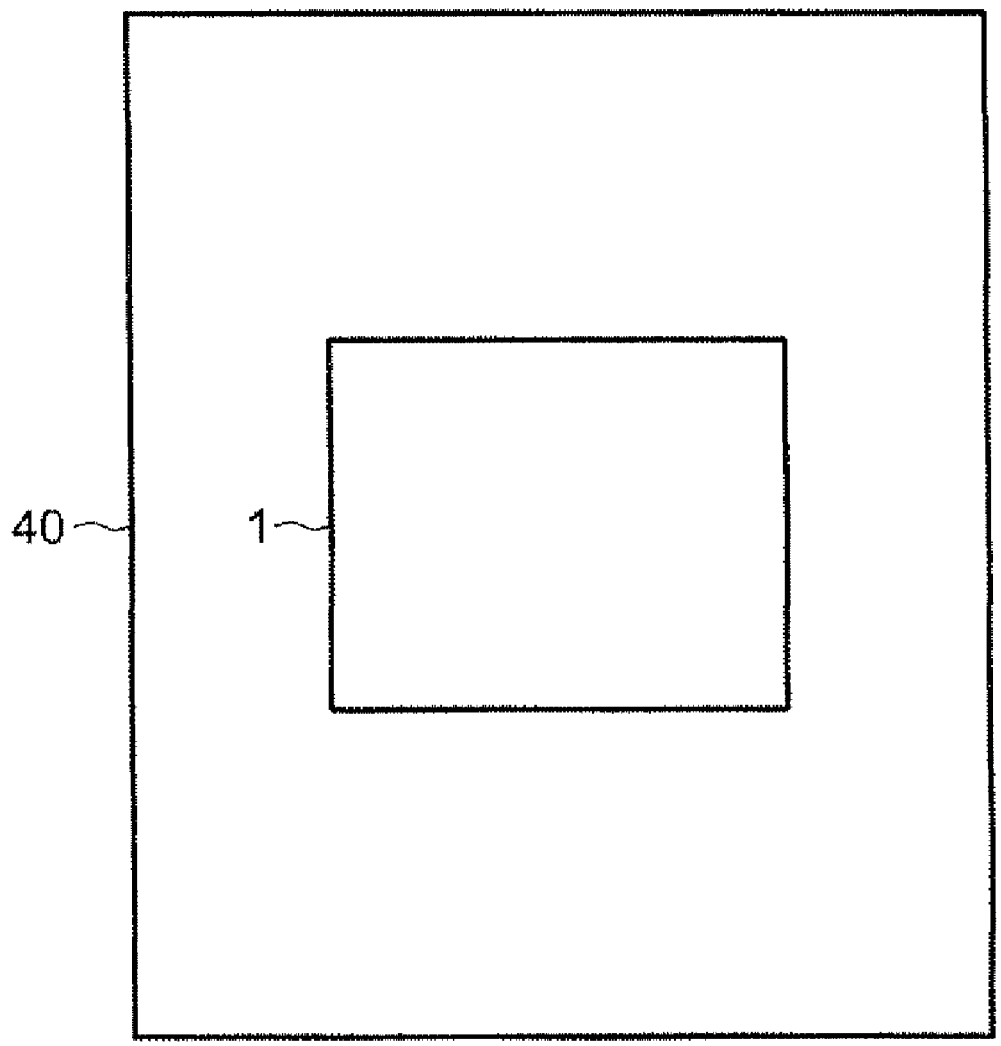
FIG. 3 is a schematic diagram of a microprocessor according to the present invention.

An embodiment of a microprocessor 40 comprising an electronic device 1 such as described hereinabove is illustrated in FIG. 3. The electronic device 1 makes it possible to drive the frequency of one or more clock signals delivered, for example, to certain internal elements of the microprocessor 40.

That which is claimed:

1. A method of driving a frequency of a clock signal to be delivered to at least one portion of an integrated circuit comprising at least one transistor having a gate of less than or equal to forty-five nanometers in length, the method comprising:
   determining a temperature of the at least one portion of the integrated circuit; and
   increasing the frequency of the clock signal based upon an increase in the temperature.

2. The method according to claim 1, wherein the gate has a length less than or equal to thirty-two nanometers.

3. The method according to claim 1, wherein increasing the frequency of the clock signal comprises increasing the frequency of the clock signal by tiers corresponding to temperature tiers.

4. The method according to claim 1, further comprising halting the increasing of the frequency of the clock signal when the temperature is greater than a threshold temperature.

5. The method according to claim 1, further comprising decreasing the frequency of the clock signal based upon a decrease in the temperature.

6. The method according to claim 1, wherein the at least one portion of the integrated circuit comprises a plurality of transistors defining a plurality of logic gates.

7. An electronic device comprising:
   a controlled generator configured to generate an adjustable frequency clock signal and having an output;
   an integrated circuit portion coupled to the output of said controlled generator and comprising
      at least one transistor having a gate of less than or equal to forty-five nanometers in length, and
      a determination circuit configured to determine a temperature of the integrated circuit portion; and
   a drive circuit coupled to the determination circuit and configured to control said controlled generator to increase a frequency of the adjustable frequency clock signal based upon an increase in the temperature.

8. The electronic device according to claim 7, wherein the gate of said at least one transistor has a length less than or equal to thirty-two nanometers.

9. The electronic device according to claim 7, wherein the gate of said at least one transistor comprises a metal layer.

10. The electronic device according to claim 7, wherein the gate of said at least one transistor comprises a dielectric material layer having a relative permittivity greater than five.

11. The electronic device according claim 7, wherein said drive circuit is configured to control said controlled generator to increase the frequency of the adjustable frequency clock signal by tiers corresponding to temperature tiers.

12. The electronic device according to claim 7, wherein said drive circuit comprises a protection circuit configured to control said controlled generator to halt the increasing of the frequency of the adjustable frequency clock signal when the temperature is greater than a threshold temperature.

13. The electronic device according to claim 7, wherein said drive circuit is configured to control said controlled generator to decrease the frequency of the adjustable frequency clock signal based upon a decrease in the temperature.

14. The electronic device according to claim 7, wherein said integrated circuit portion comprises a plurality of transistors defining a plurality of logic gates.

15. The electronic device according to claim 14, wherein each gate of said plurality of transistors has a length less than or equal to thirty-two nanometers.

16. A microprocessor comprising:
   a controlled generator configured to generate an adjustable frequency clock signal;
   at least one transistor having a gate of less than or equal to forty-five nanometers in length;
   a determination circuit configured to determine a temperature; and
   a drive circuit coupled to the determination circuit and configured to control said controlled generator to increase a frequency of the adjustable frequency clock signal based upon an increase in the temperature.

17. The microprocessor according to claim 16, wherein the gate of said at least one transistor has a length less than or equal to thirty-two nanometers.

18. The microprocessor according to claim 16, wherein the gate of said at least one transistor comprises a metal layer.

19. The microprocessor according to claim 16, wherein the gate of said at least one transistor comprises a dielectric material layer having a relative permittivity greater than five.

20. The microprocessor according claim 16, wherein said drive circuit is configured to control said controlled generator to increase the frequency of the adjustable frequency clock signal by tiers corresponding to temperature tiers.

21. The microprocessor according to claim 16, wherein said drive circuit comprises a protection circuit configured to control said controlled generator to halt the increasing of the frequency of the adjustable frequency clock signal when the temperature is greater than a threshold temperature.

22. The microprocessor according to claim 16, wherein said drive circuit is configured to control said controlled generator to decrease the frequency of the adjustable frequency clock signal based upon a decrease in the temperature.

* * * * *